(12) United States Patent
Wallner

(10) Patent No.: US 9,065,195 B2
(45) Date of Patent: Jun. 23, 2015

(54) FRONT PLUG FOR A PLC MODULE

(71) Applicant: Siemens Aktiengesellschaft, Munich (DE)

(72) Inventor: Lorenz Wallner, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 140 days.

(21) Appl. No.: 13/853,716

(22) Filed: Mar. 29, 2013

(65) Prior Publication Data
US 2013/0260619 A1 Oct. 3, 2013

(30) Foreign Application Priority Data
Apr. 2, 2012 (EP) .................................... 12162812

(51) Int. Cl.
| | | |
|---|---|---|
| *H01R 4/50* | (2006.01) | |
| *H01R 13/46* | (2006.01) | |
| *H01R 13/629* | (2006.01) | |
| *H01R 9/24* | (2006.01) | |
| *H01R 13/50* | (2006.01) | |
| *H05K 7/14* | (2006.01) | |
| *H01R 4/30* | (2006.01) | |

(52) U.S. Cl.
CPC .............. *H01R 13/46* (2013.01); *H01R 13/629* (2013.01); *H01R 4/30* (2013.01); *H01R 9/2425* (2013.01); *H01R 13/501* (2013.01); *H05K 7/1469* (2013.01)

(58) Field of Classification Search
CPC ............................ H01R 12/727; H01R 13/501
See application file for complete search history.

(56) References Cited

U.S. PATENT DOCUMENTS

| | | | | |
|---|---|---|---|---|
| 5,253,140 | A * | 10/1993 | Inoue et al. ..................... | 361/728 |
| 5,302,136 | A * | 4/1994 | St. Germain et al. ......... | 439/376 |
| 6,358,080 | B1 * | 3/2002 | Conorich ....................... | 439/341 |
| 6,361,336 | B1 * | 3/2002 | Zhao et al. ..................... | 439/157 |
| 7,534,126 | B2 * | 5/2009 | Ozawa et al. .................. | 439/353 |
| 8,011,936 | B2 * | 9/2011 | Goto ............................. | 439/76.1 |
| 8,435,079 | B1 * | 5/2013 | Osa et al. ...................... | 439/668 |

FOREIGN PATENT DOCUMENTS

| | | |
|---|---|---|
| DE | 37 35 928 A1 | 5/1989 |
| DE | 20 2011 105337 U1 | 11/2011 |
| WO | WO 92/15126 A1 | 9/1992 |

* cited by examiner

*Primary Examiner* — Michael Zarroli
(74) *Attorney, Agent, or Firm* — Cozen O'Connor

(57) ABSTRACT

A front plug for a PLC module, where the front plug includes a top and bottom contact strip that is connected to the top contact strip by a hinge for moving the top contact strip between an open and closed condition, the contacts of the top and bottom contact strip are in the closed condition arranged electrically insulated laterally mutually offset and enable contact with mating contacts of the PLC module requiring to be connected via the front plug, and contact with the mating contacts is enabled at least partially on a side of the bottom contact strip that side faces away from the top side.

8 Claims, 2 Drawing Sheets

FRONT PLUG FOR A PLC MODULE

BACKGROUND OF THE INVENTION

1. Field of the Invention

The invention relates to a front plug for a PLC module and to a PLC module for accommodating the front plug.

2. Description of the Related Art

Programmable logic controllers (PLCs) are devices for controlling or regulating machinery or industrial installations. The elements employed therefor are usually housed in what are termed modules, with a module being defined as a self-contained object that can in turn consist of individual subassemblies and components. A module is thus a constituent part of an industrial installation or automation system and serves, by means of its programmable logic controller, to control or regulate the relevant equipment and machinery belonging to the installation.

Modules are the interfaces to industrial processes. A multifarious range of modules enables all kinds of functions to be accommodated on a modular basis. Modules thus support a wide variety of technological tasks and offer extensive communication possibilities.

A module's practical deployment requires relevant components of the automation installation or system to be electrically connected to the module. For example, it is necessary for various sensors and actuators that are used for the purpose of automating an installation to be connected to the modules that are used for providing the control.

SUMMARY OF THE INVENTION

It is an object of the invention to provide an improved front plug for a PLC module and an improved module for accommodating the front plug.

This and other objects and advantages are achieved in accordance with the invention by providing a front plug for a PLC module, where the front plug includes a top and bottom contact strip, the bottom contact strip is hinged to the top contact strip for moving the top contact strip between an open and closed condition, the contacts of the top and bottom contact strip are in the closed condition arranged electrically insulated laterally mutually offset and enable contact with mating contacts of the PLC module requiring to be connected via the front plug, and contact with the mating contacts is enabled at least partially on a side of the bottom contact strip that faces away from the top side.

In certain embodiments of the invention, the number of possible contacts is advantageously allowed to be significantly increased with a given size of the connecting elements used for connecting the cables being maintained. For example, it is possible to almost double the number of contacts through their being laterally mutually offset.

It is true that because of the increasing miniaturization of electronic components, modules that are employed are becoming ever more efficient while occupying the same space, which is why ever more cables are having to be connected to a single module for communicating with the automation installation's cited components.

However, the screw terminals used therefor cannot be miniaturized at will because, on the one hand, the screw terminals of course still have to be worked by human operators and, on the other, they also have to carry a certain electric current. In the case of terminals that are too small, the cables requiring to be connected can no longer have large cross-sections so that the current requiring to be carried will need to be reduced.

That means that while, on the one hand, the number of cables having to be connected to a single module can be increased by increasingly miniaturizing the terminals used therefor and moving them closer together, it is an advantage gained at the expense of the ease with which wiring work can be performed or at the expense of the maximum cable diameter still capable of being inserted into the terminals. A certain spacing also has to be maintained between terminals to ensure that the electric insulation will be provided. The number of terminals per unit of area is limited by that factor also.

This is precisely where the described embodiments of the invention could have the advantage of allowing the number of possible contacts to be significantly increased owing to their distribution in the top and bottom contact strip and regardless of a miniaturizing of all components.

Because, furthermore, according to embodiments of the invention, a part of the contacts are located on the top contact strip and a part of the contacts are located on the bottom contact strip and the respective contact strip can be moved via a hinge between an open and a closed condition, in the open condition it is possible to mount the relevant cables on the respective terminals in an easily accessible manner. In the closed condition, it will then be possible to enable the electric connection between the contacts of the top contact strip and the mating contacts of the PLC module. The electric connection between the contacts of the bottom contact strip and the corresponding mating contacts of the PLC module will exist independently of the top contact strip's open or closed condition.

In the open condition, the contacts of the top contact strip are preferably separated from the mating contacts of the PLC module. What in particular is ensured thereby is that the top contact strip will automatically be without current in the open condition. It is thereby made possible to install cables to the contacts of the top contact strip with no current flowing. That of course applies only to voltages themselves also fed out from the PLC module.

It is furthermore preferable for the module's load voltage to be fed in via the top contact strip. All the module's outputs fed via the load voltage will thereby automatically be without current in the open condition regardless of whether the associated contacts and the cables connected to the contacts are located on the top or bottom contact strip.

Overall what is thus achieved thereby is a resolution of the problem of having to wire the contacts only in their non-energized condition for safety reasons. That is achieved automatically by the described mechanism that switches the contacts to the non-energized condition even before their possibly being touched. Other mechanisms exhibiting that functionality which a user has to trigger manually, such as by first switching off the power supply unit, do not readily promote consistent use by the persons employing them owing to a lack of convenience.

Be it noted at this point that the front plug itself can be unplugged from the PLC module and hence from the mating contacts in the PLC module so that it is even possible to perform the process of connecting the cables to a terminal or generally to the respective contacts of the top and bottom contact strip in a convenient manner in the unplugged condition. Within the scope of the present invention, the cables can basically be connected to the contacts in a manner, such that screw terminals or corresponding spring-loaded alligator clips are employed therefor. Other connecting options known from the prior art are, though, also possible, for example, using latching connections or suchlike. Thanks to the front plug that can be unplugged, it will in particular also be possible to replace a defective PLC module without having to detach all the cables from the old module's terminals and reconnect them to the new module.

According to an embodiment of the invention, the hinge is an eccentric hinge. If a slightly eccentric hinge is used here, it will be possible to fold the top contact strip open almost completely without colliding with possibly adjacent modules of the same height. Thus, the contacts in the cover will also be more easily accessible in the folded-open condition, for example, for connecting relevant cables to the contacts.

According to another embodiment of the invention, a module closure or module cover for the PLC module is located on the top contact strip on the side thereof facing away from the bottom contact strip. The closure or cover typically required for the relevant modules is therefore replaced by the cover (module closure/cover) located on the front plug. Consequently, instead of employing a separate module closure or cover for the PLC module without any additional function, it is provided for furnishing the top contact strip on the underside of the cover so that the space available for contacts and corresponding connecting elements will be doubled. That "side effect" of embodiment the invention is a result particularly also of the front plug's embodiment in which the contacts of the top contact strip have in the open condition automatically been separated from the mating contacts of the PLC module. Two advantages at once can hence be achieved synergistically by means of the front plug, namely—with the front plug in the open condition—simplified cable installing which, as no current is flowing, will be non-hazardous, and a simultaneous increase in the overall density of the contacts that can be used in the front plug.

According to an embodiment of the invention, a cable channel is provided between the top and bottom contact strip in the closed condition. For example, the cable channel has guard walls for stabilizing cables required for contacting the contacts, where the guard walls extend between the top and bottom contact strip. In the closed condition of the top and bottom contact strips, the guard walls extend preferably almost perpendicularly to the contact strips. A cavity serving as a cable channel is thus formed between the closed front cover and the PLC module, possibly projecting through the underside of the front cover. So that the cables will not be trapped by the contacts when the cover is closed, a corresponding guard wall preventing the cables from being able to slip out of the cable channel is thus provided preferably both on the top contact strip and alternatively or additionally on the PLC module itself.

It is therefore possible to locate corresponding guard walls on the PLC module itself, which walls will therein extend into the cable channel and so at least partially into the front plug. It is alternatively or additionally possible to provide such a corresponding guard wall or a plurality of guard walls on the top contact strip, where the guard walls, in the event that guard walls on the PLC module and top contact strip are combined, come to be situated one above the other when the top and bottom contact strip are in the closed condition.

According to another embodiment of the invention, the bottom contact strip has recesses for accommodating intermediate plugs, where the intermediate plugs form an extension to the contacts of the top contact strip and/or the intermediate plugs are part of the mating contacts of the PLC module requiring to be connected via the front plug, and the recesses further are configured to enable connection of the contacts of the top contact strip to the intermediate plugs. There are thus two possibilities which, when applicable, can also be mutually combined. In a first embodiment, the contacts of the top contact strip have "long" intermediate plugs, which by projecting through the recesses in the bottom contact strip, can establish a direct contact with the mating contacts of the PLC module. In a second embodiment, by contrast, the PLC module itself has long intermediate plugs that are permanently connected to the mating contacts of the PLC module and can project through the recesses in the bottom contact strip.

The intermediate plugs of the PLC module hence again directly establish the contact with the contacts of the top contact strip. In all cases, the cited intermediate plugs therefore establish a contact directly with the mating contacts of the printed-circuit board of the PLC module without the circuitous route via corresponding contacts on the front plug. Thus, both the contacts of the bottom contact strip and the contacts of the top contact strip have precisely just one single transfer point to the respective mating contacts of the PLC module.

According to an embodiment of the invention, the intermediate contacts and the contacts of the bottom contact strip mutually engage. For example, it is possible to arrange corresponding intermediate contacts and contacts of the bottom contact strip concentrically relative to each other in the closed condition.

According to another embodiment the invention, the contacts of the top contact strip and the contacts of the bottom contact strip are arranged in a line alternatingly one behind the other for forming the contacts' laterally mutually offset arrangement.

According to a further embodiment the invention, top clamping means are located on the contacts of the top contact strip, where the top clamping means is configured to contacting the contacts of the top contact strip with cables required therefor. Bottom clamping means are furthermore located on the contacts of the bottom contact strip, where the bottom clamping means is configured to contact the contacts of the bottom contact strip with cables required therefor. The top clamping means and bottom clamping means are therein arranged electrically insulated in a line one above the other when the top and bottom contact strip are in the closed condition. The available space that is available for the clamping means will hence have been optimally filled and the number of terminals that can be accommodated will be doubled.

According to another embodiment of the invention, the contacts of the top contact strip have in the open condition no contact with the mating contacts of the PLC module. Those terminals could, for example, be occupied preferably by outputs of the module so that they will automatically be without current when the relevant cables are attached with the cover open. For example, a risk of injury to persons accordingly mounting the front plugs will be minimized thereby. It is in particular also possible to feed in a supply voltage or load voltage of the PLC module exclusively via the contacts of the top contact strip. All the module's outputs will in the absence of load voltage hence automatically be without current in the open condition.

It is also an object of the invention to provide a PLC module for accommodating the above-described front plug.

An automation network having automation components controlled by PLC modules can comprise within the scope of the present description, for example, an industrial automation network. Industrial automation networks of such kind can be configured, equipped, and/or provided for, for example, controlling, and/or regulating industrial installations (for example production plant, conveyors, etc.), machinery, and/or devices. Automation networks or, as the case may be, industrial automation networks can in particular have real-time communication protocols (for example, Profinet, Profibus, Real-Time Ethernet) for communication at least between the components involved in the controlling and/or regulating functions (for example, between the control units and the installations and/or machinery being controlled). The reliable transmission of data via storage media is likewise covered.

Alongside a real-time communication protocol it is, though, furthermore also possible for at least one other communication protocol (which, for example, does not need to have real-time capability) to be provided in the automation network or, as the case may be, industrial automation network, for example for monitoring, setting up, reprogramming, and/or reparameterizing one or more control units in the automation network.

An automation network can include, for example, wired communication components and/or wireless communication components. An automation network can furthermore include at least one automation device.

An automation network includes a plurality of sensors and actuators. The actuators and sensors are controlled by at least one control device. The actuators, sensors, and at least one control device mutually exchange data. An automation protocol is used for the exchange of data. The at least one control device controls the actuators, sensors, and data exchange such that a machine-based production process will be performed during which, for example, a product is produced.

An industrial automation device can be, for example, a programmable logic controller (PLC), a module or part of a programmable logic controller, a programmable logic controller integrated in a computer or PC, and corresponding field devices, sensors and/or actuators, and input and/or output devices or suchlike for connecting to a programmable logic controller, or can include such.

What is understood as an automation protocol within the meaning of the present invention is any kind of protocol that is provided, suitable, and/or equipped for communicating with automation devices according to the present description. Automation protocols of such kind can be, for example, the Profibus protocol (conforming, for example, to Industrial Electrotechnical Commission (IEC) standard 61158/EN50170), a Profibus DP protocol, a Profibus PA protocol, a Profinet protocol, a Profinet IO protocol, a protocol conforming to AS-Interface, a protocol conforming to IO-Link, a KNX protocol, a protocol conforming to a Multi-Point Interface (MPI), a protocol for a Point-to-Point (PtP) coupling, a protocol conforming to the specifications of S7 communication (which protocol is provided and equipped for, for example, the communication of programmable logic controllers from the company Siemens), or an Ethernet Industrial protocol or Real-Time Ethernet protocol, or other specific protocols for communicating with automation devices. Any combinations of the aforementioned protocols can also be provided as an automation protocol within the meaning of the description.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Preferred embodiment variants of the invention are explained below with the aid of the drawings, which.

DETAILED DESCRIPTION OF THE PREFERRED EMBODIMENTS

Figure 1:
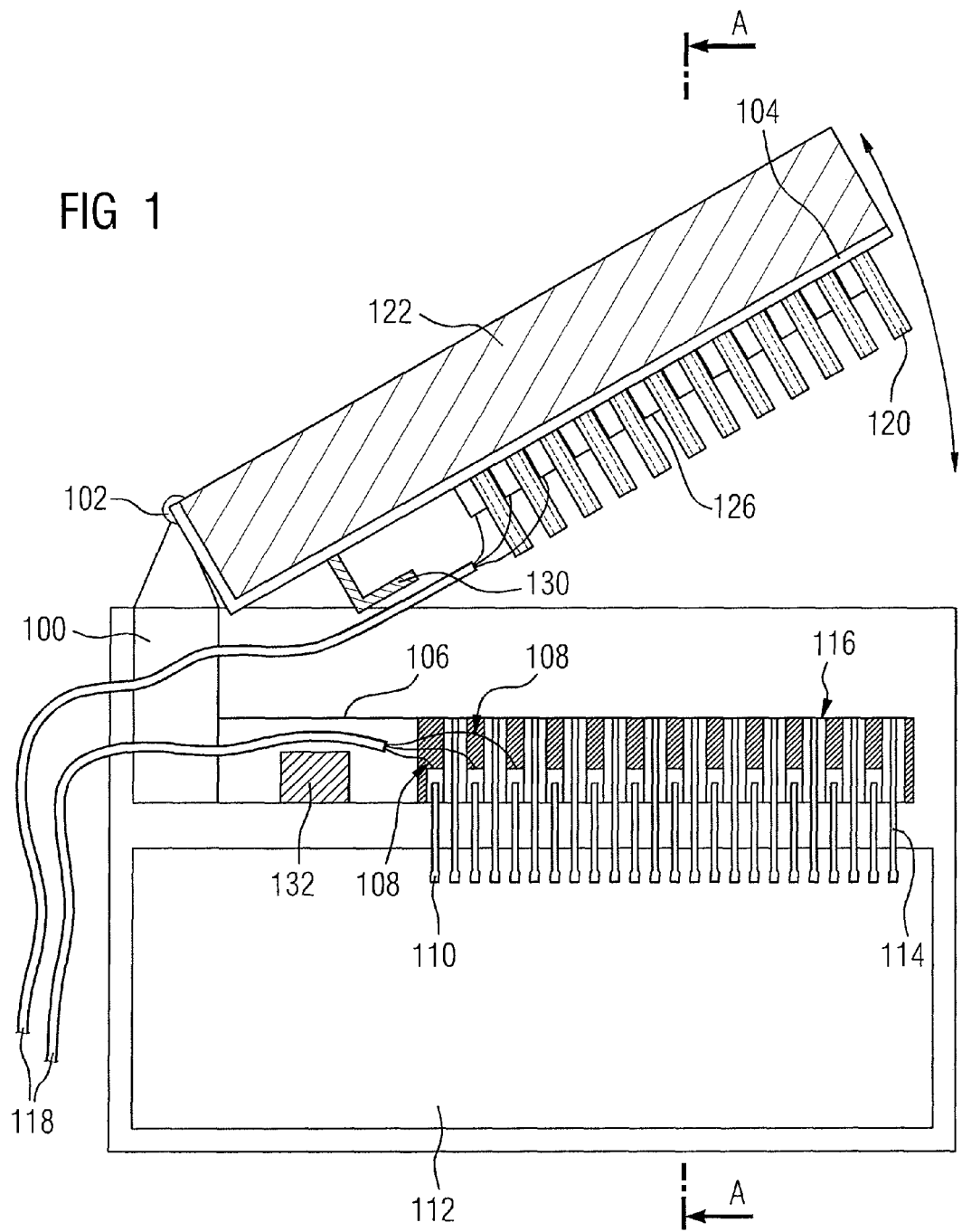
FIG. 1 is a side view of a front plug located on a PLC module.

Elements similar to each other are identified in the following by the same reference numerals.

FIG. 1 is a schematic side view of a front plug 100 for a PLC module. Front plug 100 has a top contact strip 104 and a bottom contact strip 106 that are joined via an eccentric hinge 102. Top contact strip 104 can be swiveled relative to bottom contact strip 106 via hinge 102 and thereby moved between an open and closed condition.

Front plug 100 has been inserted via its bottom contact strip 106 into PLC module 112. PLC module 112 therein has electric mating contacts 110 and 114. Because of the inserted condition, mating contacts 110 therein engage with contacts 108 of bottom contact strip 106. Instead of mutually engaging, it is also possible for contacts 108 and 110 only to come to lie flat one upon the other.

Bottom contact strip 106 has recesses 116 through which mating contacts 114 of the PLC module 112 project. Mating contacts 114 therein serve to make contact with intermediate contacts 120 of top contact strip 104. In the embodiment shown in FIG. 1, intermediate contacts 120 are therein identical to corresponding contacts of top contact strip 104. What are termed cable terminals are provided to then electrically connect cables 118 to corresponding contacts 108 or, as the case may be, 120. The cable terminals can have, for example, screw mechanisms connecting cables 118 to contacts 108 or, in the case of top contact strip 104, to cable terminals 126. Cable terminals 126 of top contact strip 104 are in electrical contact with the respectively assigned contacts or, as the case may be, intermediate contacts 120.

When in the shut position, folding front plug 100 will cause intermediate contacts 120 to be electrically connected to mating contacts 114 of PLC module 112. For example, intermediate contacts 120 can have corresponding recesses into which mating contacts 114 inside recess 116 engage when folding shut occurs. It is, though, possible also for only the top sides of intermediate contacts 120 and of respective mating contacts 114 to come to rest one upon the other when folding shut occurs. All that is necessary overall is for an electrical contact to be established between intermediate contacts 120 and mating contacts 114.

Contacts 120 and 108 are in the top and bottom contact strips' closed condition arranged electrically insulated laterally mutually offset. In FIG. 1, it can be seen that viewed from left to right the contacts of the top contact strip and the contacts of the bottom contact strip are arranged so as to mutually alternate in sequence. The respective contacts are therefore arranged spatially in a line alternatingly one behind the other for forming the laterally mutually offset arrangement of contacts 120 or, as the case may be, 108.

Furthermore, located on top contact strip 104 is a module cover or module closure 122 which, in the closed condition, covers PLC module 112. Both the PLC module and the front plug itself will be protected from dust and other environmental influences by the covering. It should be noted that the module cover can be formed also by top contact strip 104 itself, so that the provision of an extra cover component 122 can be omitted.

Figure 2:
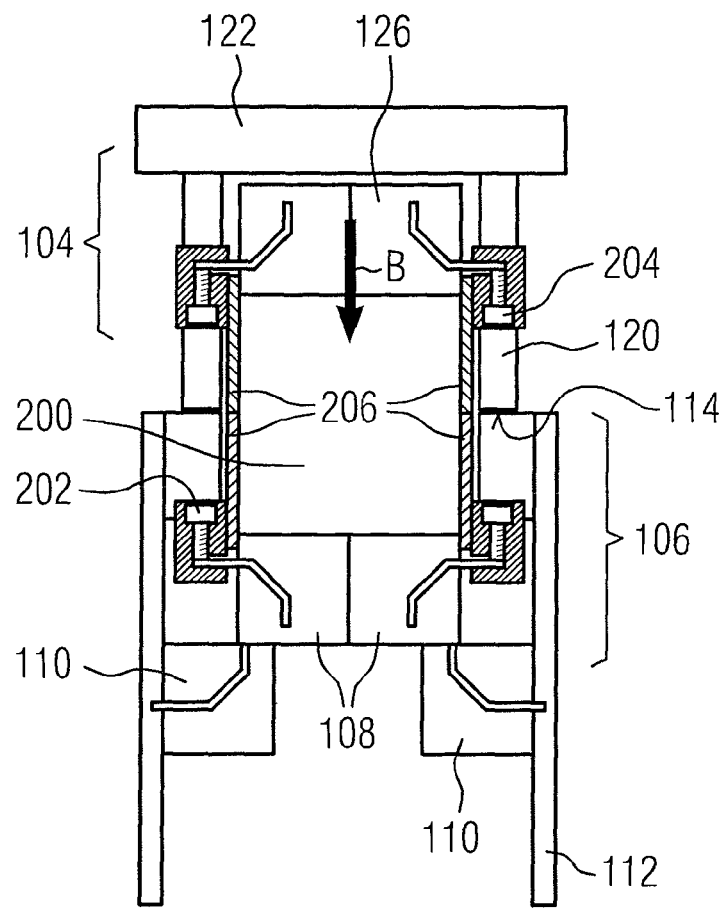
FIG. 2 is a cross-sectional view through the front plug of FIG. 1 with the front cover closed.

FIG. 2 is a cross-sectional view through front plug 100 with front cover 122 closed, meaning with the module closure or module cover in place, where in that case top contact strip 104 and bottom contact strip 106 come to rest one above the other via hinge 102. That view therein corresponds to a cross-sectional view through the plane shown in FIG. 1 having the letter A.

Clearly visible here for top contact strip 104 are cable terminals 126 to which cables that are not shown in FIG. 2 can be connected by corresponding screws 204. Located under screw connections 204 and in electrical contact with cable terminal 126 are intermediate contacts 120. Intermediate contacts 120 therein lie flat upon corresponding mating contacts 114 of PLC module 112.

Mating contacts 110 are analogously lying on corresponding contacts 108 of bottom contact strip 106, with bottom contacts 108 serving simultaneously also as cable terminals. The cables to be connected here, though not shown in FIG. 2, can again be secured to bottom contacts 108 by corresponding screw connections 202.

A cable channel 200 offering space for laying the cables connected to contacts 108 or, as the case may be, 126 is formed in the closed condition between top contact strip 104 and bottom contact strip 112. However, so that the cables will not be crushed by, for example, intermediate contacts 120 when folding shut occurs, there are corresponding guard walls 206 on both top contact strip 104 and PLC module 112. Cable channel 200 is ultimately defined by the guard walls.

As is clear from FIGS. 1 and 2, the space for locating is doubled thanks to the favorable arrangement of cable terminals 126 or, as the case may be, 108. That provides the possibility of using more or overall larger terminals occupying the same space. Terminals 126 have no contact with module 112 when the cover is in the open condition. The terminals could, for example, be occupied preferably by outputs of the module so they will automatically be without current when the corresponding cables are being attached with the cover open. For example a risk of injury to persons accordingly mounting the front plugs will be minimized thereby.

In the case of both contacts 108 and contacts 120, contact with the corresponding printed-circuit board of PLC module 112 is established via just a single pluggable contact, i.e., the path from the respective terminal to the printed circuit board is relatively short. Contacts 120 and 108 are therefore to be regarded as identical in terms of electrical properties, such as their contact resistances.

Existing modules can also be readily upgraded by the front plug shown in FIGS. 1 and 2. The possibly existing cover of existing modules would then only have to be replaced with the entire front plug.

Also possible for relieving cables 118 shown in FIG. 1 is the use of an automatic cable clamp when the cover is closed. The cable clamp's mechanism is therein identified in FIG. 1 by the reference numeral 130. Punch-shaped cable clamp 130 is pressed onto cables 118 when top contact strip 104 is closed. The cables will thereby either be pressed directly onto bottom contact strip 106 in the closed condition or, alternatively, support block (stop) 132 that can be seen in FIG. 1 and onto which the cables are pressed via cable clamp 130 can be used. If block 132 has, for example, a V-shaped or U-shaped recess, then what can be ensured automatically in the recess when the top contact strip is closed is that cables 118 will be centered in the cable channel and at the same time (through being clamped into position) secured against being accidentally pulled out. A suitable arresting mechanism can preferably be provided that will also keep the top and bottom contact strip closed in the closed condition. Appropriate detent means, for example, could be employed here between the top and bottom contact strip.

Cables 118 will hence be relieved by cable clamp 130. It should be noted that it is irrelevant whether cable clamp 130 is located on the top or bottom contact strip.

Top contact strip 104 being elongated in shape, the automatic consequence will be a relatively large amount of leverage by which a useful force can conveniently be transmitted to securely clamp cables 118 into position.

Located for that purpose on the underside of the top contact strip is a punch that presses onto a counterstop, for example, a small plate which by means of suitable rails is able to move only vertically in the direction in which the top and bottom contact strips extend. The cable will thereby be pressed against a stop while the top contact strip is closing so that the cable will be reliably arrested. The punch will move with the top contact strip, for example, when it is closing along a circular path. Thus, alongside a vertical component causing the actual pressing action, there will also be a horizontal component to the motion during the moving process (opening or closing). The cable could be damaged by the horizontal component owing to tensile forces. It is ensured by the horizontally movable counterstop that in actuality only the vertical motion component will act upon the cable. It should be noted that that is of course independent of a specific arrangement of the contacts and of the cover's presence.

The counterstop is preferably spring-biased in terms of its ability to move vertically. As a result, counterstop will, when the top contact strip is opened, automatically adopt an initial position from which it will then be moved reversibly vertically when the top contact strip is closed.

Elastic materials, such as sponge rubber or foam, has preferably been attached to cable clamp 130 and/or stop 132 to better distribute the force on cables 118.

It should be noted that the top contact strip ought preferably to be detachable so that it will be possible to conveniently insert or, as the case may be, remove cables 118.

For reinserting the top contact strip, there should therein be various accommodation points for the hinge by which the top contact strip is linked to the bottom contact strip. That will enable the distance between the top and bottom contact strip and hence between the punch and small plate to be variably set. It will consequently in particular be possible to arrest cables of different thickness.

What, therefore, emerges here is that the top contact strip has a two-fold use: On the one hand, it can be used as a cover of the module and, on the other, it can be used as a lever for the clamping mechanism. The advantage is that the process of arresting the cables is smoothly integrated in the sequence of operations occurring in any event when the cables are being connected to the module. First the top contact strip is folded open for gaining access to cable terminal 108 or, as the case may be, 126. The cables will be automatically released from clamp 130 when that is done. The cables are thereafter connected to the terminals as required. The cables will be automatically arrested again when the cover is then closed by folding down the top contact strip. That hence overall means greater convenience when working with the module because no additional resources (cable ties, for instance) will be needed for arresting the cables.

Figure 3:
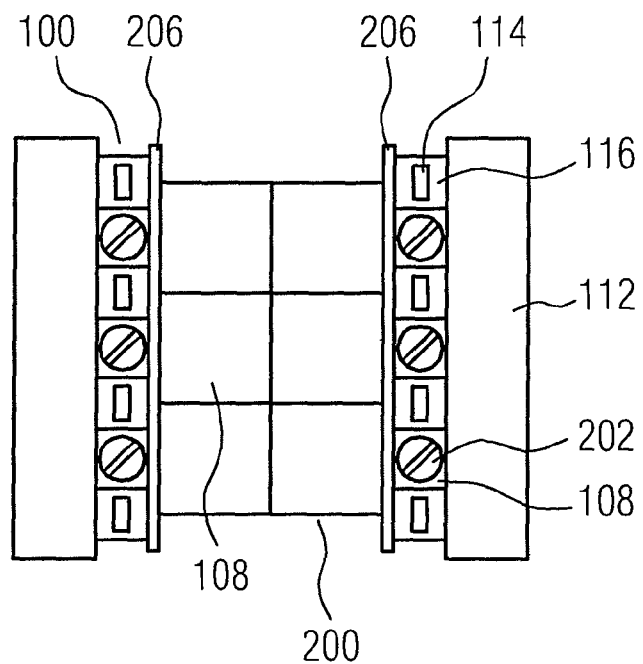
FIG. 3 is a view onto a front plug in its installed condition in a PLC module.

FIG. 3 is a view onto front plug 100 along sectional plane B shown in FIG. 2. Cover 122 and contact strip 104 along with the corresponding contacts have been omitted here for representational reasons.

What can now be seen are the cable terminals or, as the case may be, contacts 108 to which corresponding cables can be secured by screws 202. Ducted laterally along screw connections 202 are in turn guard walls 206 which, located mutually opposite, form a channel 200 for cables requiring to be accommodated. Further to be seen are recesses 116 in bottom contact strip 106, with mating contacts 114 of PLC module 112 projecting through the recesses 116. Contact between mating contacts 114 and intermediate contacts 120 can hence occur when the front cover is in the closed condition. Likewise in the closed condition, cable terminals 126 or, as the case may be, 108 and also corresponding screw connections 204 or, as the case may be, 202 will as can be seen in FIG. 2 then be arranged electrically insulated in a line one above the other. Thus, the clamps formed by cable terminals 126 and screws 204 or, as the case may be, cable terminals 108 and screws 202 will overall be arranged in a line one above the other.

Thus, while there have shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A front plug for a PLC module, comprising:
   a top contact strip;
   a bottom contact strip;
   a hinge interconnecting the top and bottom contact strips; and
   a cable channel located between the top and bottom contact strips in a closed condition;
   wherein the hinge moves the top contact strip between an open and the closed condition;
   wherein contacts of the top and bottom contact strips in the closed condition are arranged in an electrically insulated laterally mutually offset manner and enable contact with mating contacts of the PLC module requiring connection via the front plug;
   wherein contact with the mating contacts is enabled at least partially on a side of the bottom contact strip which faces away from a top side of the plug; and
   wherein the cable channel includes guard walls for stabilizing cables required for contacting the mating contacts, the guard walls extending between the top and bottom contact strips.

2. The front plug as claimed in claim 1, wherein the hinge is an eccentric hinge.

3. The front plug as claimed in claim 1, further comprising:
   a module closure or module cover for the PLC module, the module closure or module cover being located on the top contact strip on a side thereof facing away from the bottom contact strip.

4. The front plug as claimed in claim 1, wherein the bottom contact strip includes recesses for accommodating intermediate plugs, the intermediate plugs at least one of forming an extension to the contacts of the top contact strip and being part of the mating contacts of the PLC module requiring to be connected via the front plug;
   wherein the recesses are configured to enable contacts of the top contact strip to be connected to the intermediate plugs.

5. The front plug as claimed in claim 4, wherein the intermediate plugs and contacts of the bottom contact strip mutually engage.

6. The front plug as claimed in claim 1, further comprising:
   top clamping structure located on contacts of the top contact strip, the top clamping structure being configured to contact the contacts of the top contact strip with cables required therefor;
   a bottom clamping structure located on contacts of the bottom contact strip, the bottom clamping structure being configured to contact the contacts of the bottom contact strip with cables required therefor;
   wherein the top and bottom clamping structures are arranged electrically insulated in a line one above another when the top and bottom contact strips are in the closed condition.

7. The front plug as claimed in claim 1, wherein the top contact strip is reversibly detachable from the bottom contact strip.

8. A PLC module including the front plug as claimed in claim 1.

* * * * *